(12) United States Patent
Lee et al.

(10) Patent No.: US 6,425,987 B1
(45) Date of Patent: Jul. 30, 2002

(54) TECHNIQUE FOR DEPOSITION OF MULTILAYER INTERFERENCE THIN FILMS USING SILICON AS THE ONLY COATING MATERIAL

(75) Inventors: Cheng-Chung Lee, Ping-Chen; Jin-Cherng Hsu, Taipai Hsien, both of (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/584,035

(22) Filed: May 30, 2000

(30) Foreign Application Priority Data

Nov. 25, 1999 (TW) .......................... 88120812

(51) Int. Cl.⁷ .......................... C23C 14/34; B05D 5/06; B05D 1/26
(52) U.S. Cl. .......................... 204/192.11; 204/192.23; 204/192.26; 427/162; 427/402
(58) Field of Search .......................... 204/192.11, 192.23, 204/192.26; 427/162, 402

(56) References Cited

U.S. PATENT DOCUMENTS

| | | | |
|---|---|---|---|
| 4,978,437 A | * 12/1990 | Wirz .................. | 204/192.23 |
| 5,469,981 A | * 11/1995 | Srikrishnan et al. ......... | 216/13 |
| 5,783,049 A | * 7/1998 | Bright et al. .......... | 204/192.14 |
| 5,821,168 A | * 10/1998 | Jain .......................... | 438/692 |
| 5,891,556 A | * 4/1999 | Anderson et al. ........... | 428/216 |

OTHER PUBLICATIONS

"Reactive Alternating Current Magnetron Sputtering of Dielectric Layers", Scherer et al., , pp. 1772–1776 (1991).*
Applied Optics, Cheng–Chung Lee, Hsuen–Li Chen, Jin–Cherng Hsu, and Chuen–Lin Tien, "*Interference Coatings Based on Synthesized Silicon Nitride*", Apr. 1, 1999, vol. 38, No. 10, pp. 2078–2082, Institute of Optical Sciences, National Central University, Chung–Li (32), Taiwan.
[online]. Retrieved from the Internet on Oct. 9, 2001:≦URL: http://ww.ccm.ecn.purdue.edu/tfd/deposition_methods/ion_beam_sputtering.htm.

* cited by examiner

Primary Examiner—Steven H. Ver Steeg
(74) Attorney, Agent, or Firm—Conley, Rose & Tayon, P.C.

(57) ABSTRACT

A new technique is provided using only one coating material (pure silicon) to deposit thin films in a high vacuum, and using an ion source with a working gas (or gases) to control the refractive index of the thin film. This new technique can deposit different kinds of optical thin films with different refractive indices or gradient-indices and make different kinds of multilayer interference filters without opening the vacuum chamber during the process. The way of evaporation or sputtering of the coating material or target uses "electron beam evaporation", "DC or RF magnetron sputtering", or "ion beam sputtering", etc. The way of controlling the refractive index of the film involves mixing Ar with $O_2$ and $N_2$ or just the mixture of $N_2$ or $O_2$, and feeding the gases into the ion source, as shown in FIG. 1 and FIG. 2. The amount of gas and the way of feeding are controlled by computer software.

19 Claims, 8 Drawing Sheets

Step 2
Deposition of Interference Filters

(G) Input the Layer Thickness and the Refractive Index
according to the design of a multilayer thin film filter:

Examples:

(1) Broad band pass filter: Si| M (HL)³ H 0.5L| Air, where $n_M=2.4$, $n_H=3.4$ and $n_L=1.72$.

(2) Narrow band pass filter Glass| (HL)² 2H (LH)²| Air, where $n_H=3.5$ and $n_L=1.47$.

(F) Input the Deposition Parameters:
Get the Deposition Parameters from the data base stored in the computer.

(H) Run the coating layer by layer according to the processes (G) and (F) with one coating material.

(I) Finish the coating:
Get the interference filter.
Example: Fig.6 and Fig.7

TECHNIQUE FOR DEPOSITION OF MULTILAYER INTERFERENCE THIN FILMS USING SILICON AS THE ONLY COATING MATERIAL

FIELD OF THE INVENTION

This invention is a method used to produce various interference filters with only one single material in vacuum conditions. It can be applied to photo-electronic displaying, optical fiber communication, optical measure systems, energy control, to interferometer, military weapons, etc.

1. Background of the invention

Optical coating is an indispensable technique for optical systems. For example, the sensitivity of photo-electronic signals will be improved when going through optical coating. And most of the films designed for these components are multilayer interference thin films composed of two or more kinds of materials at present. However, the production of these films is more difficult due to complex refractive indices of different materials. To solve this problem, two materials, with high and low refractive index each, are mixed by co-evaporation to produce a special thin film whose refractive index falls between the original two. Although the interference effect of multilayer films is improved, its production is difficult and inconvenient to control, and the stability of the optical multilayer interference films is poor.

Currently optical thin films, often called as optical interference filters, are mostly used in treatment of optical signals and change of light properties to satisfy requirements of experiments. In spite of theoretical design availability, two or three, even more, layers of materials with different refractive indices must be used to reach the required optical effect. Due to the unique properties of each material, different coating method has to be adopted and thus the difficulty of production is greatly increased.

1. Description of the Prior Art

Lee Cheng-Chung et al, on "Interference coating based on the synthesis of silicon nitride" in Applied Optics (vol. 38, no. 1, pp. 2078–2082, 1999), disclosed that, under the conditions of using ion beam composed of $N_2^+$ mixed with $Ar^+$, Si could be made into $SiN_x$ whose refractive index changed from 3.5 to 1.72 at a wave length of 1550 nm. According to the above-said conditions, broadband pass filters, narrowband pass filters, and antireflection films could be produced and applied in optical fiber communication, laser interference devices, optical measure systems, energy control and military weapons.

SUMMARY OF THE INVENTION

The Invention uses only one single material to coat various optical thin films with different refractive indices in vacuum conditions. Multilayer filters with different refractive indices can be made at one time, with no need to replace materials in the production process. All you need to do is to change the contents of the gas in the high vacuum coating chamber. Since the production process of the Invention is pretty simple, coating machines adopting the method can be compact in design and easy to operate. Besides, the cleaning and maintenance of their coating chambers can be done easily and conveniently.

One who is familiar with the similar techniques can clearly understand the purposes and features of the invention by the illustration of the examples listed below.

BRIEF DESCRIPTION OF THE DRAWINGS

The substrate can be set as the drawing (direct monitoring) or set in a planetary substrate holder or set in a dome shape.

FIGS. 2(a), 2(b), and 2(c) Different methods to use coating material to deposit thin film.

FIGS. 3-1 and 3-2 The procedures for the deposition of multilayer interference thin films by using only one coating material.

FIG. 3-1 Step 1 of the procedures.

FIG. 3-2 Step 2 of the procedures.

The oxygen gas is partially fed into the ion source and partially fed into the chamber. The oxygen is measure in the chamber and the starting coating material is silicon.

The starting coating material is silicon. No nitrogen gas is fed into the chamber.

The refractive indices are controlled by regulating the ion current density.

Layer structure: Si|M(HL)³H 0.5L|Air.

$n_M$=2.4, $n_H$=3.4 and $n_L$=1.72. Backside of the substrate is AR-coated.

The refractive indices of the layers are controlled by ion current density and oxygen gas in the chamber.

Layer structure: Glass|(HL)²2H(LH)²|Air.

$n_H$=3.5 and $n_L$=1.47. Backside of the substrate is AR-coated.

REFERENCE NUMBER OF THE ATTACHED DRAWINGS

1 . . . substrate
2 . . . gas flow control valves
3 . . . coating material
4 . . . optical monitor
5 . . . working gas
7 . . . quartz monitor
8 . . . vacuum chamber
9 . . . neutralizer
11 . . . ion source
12 . . . to pump
14 . . . electron beam gun
15 . . . sputtering ion source
21 . . . reactive gas inlet
31 . . . power supply(DC or AC)

DETAILED DESCRIPTION OF THE INVENTION

The invention uses only one coating material to produce various optical thin films with different refractive indices by employing an electron beam gun, or DC (or AC) magnetron sputtering, or ion beam source and with an added ion source.

The invention disclose the preparation steps of deposition multilayer interference thin films, which includes (a) choose coating material, (b) deposition rate control, (c) feed suitable gases, (d) film quality control, (e) get the refractive index profile, (f) enable to deposit a thin film with required refractive index, (g) input the layer thickness and the refractive index.

The said single material is silicon—the purer the better, for instance 99.999%. The way of evaporation or sputtering coating material or target is using "electron beam evaporation", "DC or RF magnetron sputtering", or "ion beam sputtering", etc. in collaboration with an ion source to hit at the growing thin film with its ion beam. If the films after substrate coated are finished products, adopt direct monitoring method; in case of substrate holder coating or planetary substrate holder and dome shape coating, is used, then adopt indirect monitoring. And the substrate temperature should be 150° C. to 200° C.

Different rates of gas such as $N_2$, Ar, $O_2$, or their mixture can be used as the ion source. Through adjusting the ratio of the (mixed) gas and the reactivity of the gas pressure and the conditions of evaporation or sputtering source, adequate deposition rate is then obtained. The flow rate of gas is set by a computer according to the indices stored in the database; and the volume of gas flow is determined by the requirements of the refractive indices of different films, ranging from 0 to 40 sccm. If the coating is nitrides there is no need to replenish $N_2$ into the chamber, only in the ion source. However, if the coating is oxides or oxide-nitrides, then the ion source is composed Of $O_2$ or $O_2/N_2$ mixture and the chamber is replenished with $O_2$. The mixture ratio of $N_2$ and $O_2$ and its flow rat e is between 0 to 40 sccm, but under no circumstances should the rate make the vacuum extend to $7\times10^{-2}$ Pa. The rate of $N_2^+$ and $O_2^+$ mixture is 0 to 100% of $Ar^+$ content.

In addition, the ion beam voltage and current of the ion source, and the temperature of material should be adequately adjusted in order to obtain the most appropriate film quality. Adjustments include: let partial of $O_2$ flow into the ion source and partial into the coating chamber; control the density of ion current within the range of 10 $\mu A/cm^2$ to 80 $\mu A/cm^2$ better within 30 $\mu A/cm^2$ to 50 $\mu A/cm^2$; and the ion beam voltage ($V_b$) ranges from 150V to 800V Different refractive index profiles can be used as a function of deposition parameters and thus have to be stored in a computer database. In accordance with the refractive index database, the thin films required can be produced by a variety of deposition methods.

Only inputting the layer thickness and refractive index necessary for designed multilayer thin film filters, the interference filters are manufactured accordingly. The "multilayer thin film filter", so to speak, is a filter that consists of one or more thin films, such as antireflection coatings, broadband pass filters and narrowband pass filters. Different refractive indices should be taken into consideration. The said "broad band pass filters" are a kind of filter that can filtrate a variety of light whose wave lengths range from hundreds to tens of nm; and the "narrowband pass filters" are filters that filtrate light of wave lengths below tens of nm. Among which, the refractive indexes are divided by values into three groups: low, medium and high: 1.45–1.8 as $n_L$, 1.8–2.4 as $n_M$, and 2.4–3.5 as $n_H$.

As optical interference thin film filters, there are different formula that can be applied according to the required layer thickness and refractive index. For example:

Si|M(HL)³ H 0.5L|Air (1) for broadband pass filters

Si (substrate) and Air stand for the interfacial substances at both ends, "|" for the right and left interfaces, M·H·L for various materials with different refractive indices whose optical thickness is ¼ of their wave lengths respectively, "3" for coating the HL film in the ( ) 3 times, and $n_M$=2.4, $n_H$=3.4 and $n_L$=1.72. The said "optical thickness" is the product of the film's refractive index and its real geometric thickness.

Another formula is: Glass|(HL)² 2H (LH)²|Air (2) for narrowband pass filters. Glass and Air stand for the interfacial substances at both ends, "|" for the right and left interfaces, H·L for various materials with high and low refractive indices whose optical thickness is ¼ of their wave lengths respectively, "2" for coating the HL or LH film in the ( ) 2 times, and $n_H$=3.5 and $n_L$=1.47.

The preparation steps of the Invention are shown below:

Step 1

(a) Selection of original material for coating: select 99.999% purity of Si as the original material.
(b) Adjustment of deposition rate: supply the ion source with Ar, $O_2$, $N_2$ or $O_2/N_2$ mixture by adjusting the gas flow control valves according to the reactive gas pressure and the power of electron beam gun or sputtering source. The rate of said gases to Ar is between 0 to 100%.
(c) Supply of proper gas: control the gases in the ion source and coating chamber according to the conditions stated in production step (b).
(d) Adjustment of film quality: adjust proper ion beam voltage and ion beam current in the ion source, and proper material temperature in order to obtain the most appropriate film quality.
(e) Various refractive index profiles: use various refractive index profiles as a function of deposition parameters, and store them in a computer as a database.
(f) Set up the database of deposition parameters.
(g) Using the established refractive index database, produce the required thin films as per various deposit methods.

Step 2: Film Production of Interference Filters

By inputting the layer thickness and refractive index, we can design required multilayer thin film filters according to requirements.

Using any of the three methods, electron beam guns, DC, or RF magnetron and ion beam sputtering, the Invention can use only a single material to coat an optical thin film in collaboration with an ion source which hits the growing film with ion beam. Via control of the oxygen, nitrogen and argon ratio in the ion source, better optical thin films and filters can be obtained.

The advantages of the Invention are listed as follows:

1. Decrease the trouble in searching for accurate refractive indices.
2. Simplify the design of coating machines due to application of only one material.
3. Reduce contamination between materials in case two or more materials are used.
4. Simplify the production process but keep the same quality by use multiple refractive indices.
5. Be able to produce gradient-index films, even special filter components like rugate filter, broadband antireflection coating, etc. The so called "gradient-index films" are the films that have different refractive index at different thickness.
6. Large pieces of material can be used to coat multilayer filters. No need to open coating machines to adjust refractive indices. Therefore, the quality of filters is improved and the time for production is decreased.
7. The Invention can be applied in coating multilayer films for enhancing optical efficiency of semi-conductor components, broadband pass film filters, narrowband pass film filters and antireflection films, as well as coatings for optical fiber communication.

To sum up, the Invention has the features of creativity, novelty and innovativity. though the Invention uses just a few better preparation examples disclosed as above, its application will not be limited to them. Anyone who is familiar with the said technique is able to amend and/or apply the said technique partially or totally without going beyond the Invention's spirit and coverage. Thus, the protection coverage of the Invention is determined by the descriptions stated in the application of patents.

PREPARATION EXAMPLE 1

Select silicon with a purity of 99.999% as original material, adjust PC board temperature to 100~250° C., $V_b$ to 150~800V, the density of the ion source to 10~80 $\mu A/cm^2$, the percentage of $O_2$, $N_2$ or $O_{2N2}$ mixture supplied to the ion source is 0 to 100% of the Ar content. Part of the (mixed) gas is led into the ion source, and part into the coating chamber.

At the conditions of 0 $\mu A/cm^2$ nitrogen ion density and 0 torr oxygen partial pressure, thin films with a refractive index of 3.5 can be obtained. If the nitrogen ion density is 10 $\mu A/cm^2$ and oxygen partial pressure is lower than 2.5×$10^{-5}$ torr, thin films with a refractive index of 3.0 are obtained. If the nitrogen ion density is 30 $\mu A/cm^2$ and oxygen partial pressure is 5.0×$10^{-5}$ torr, thin films with a refractive index of 2.0 are obtained. While the nitrogen ion density is 40 $\mu A/cm^2$ and oxygen partial pressure is 1.0×$10^{-4}$ torr, then thin films with a refractive index of 1.75 are obtained.

PREPARATION EXAMPLE 2

Figure 1:
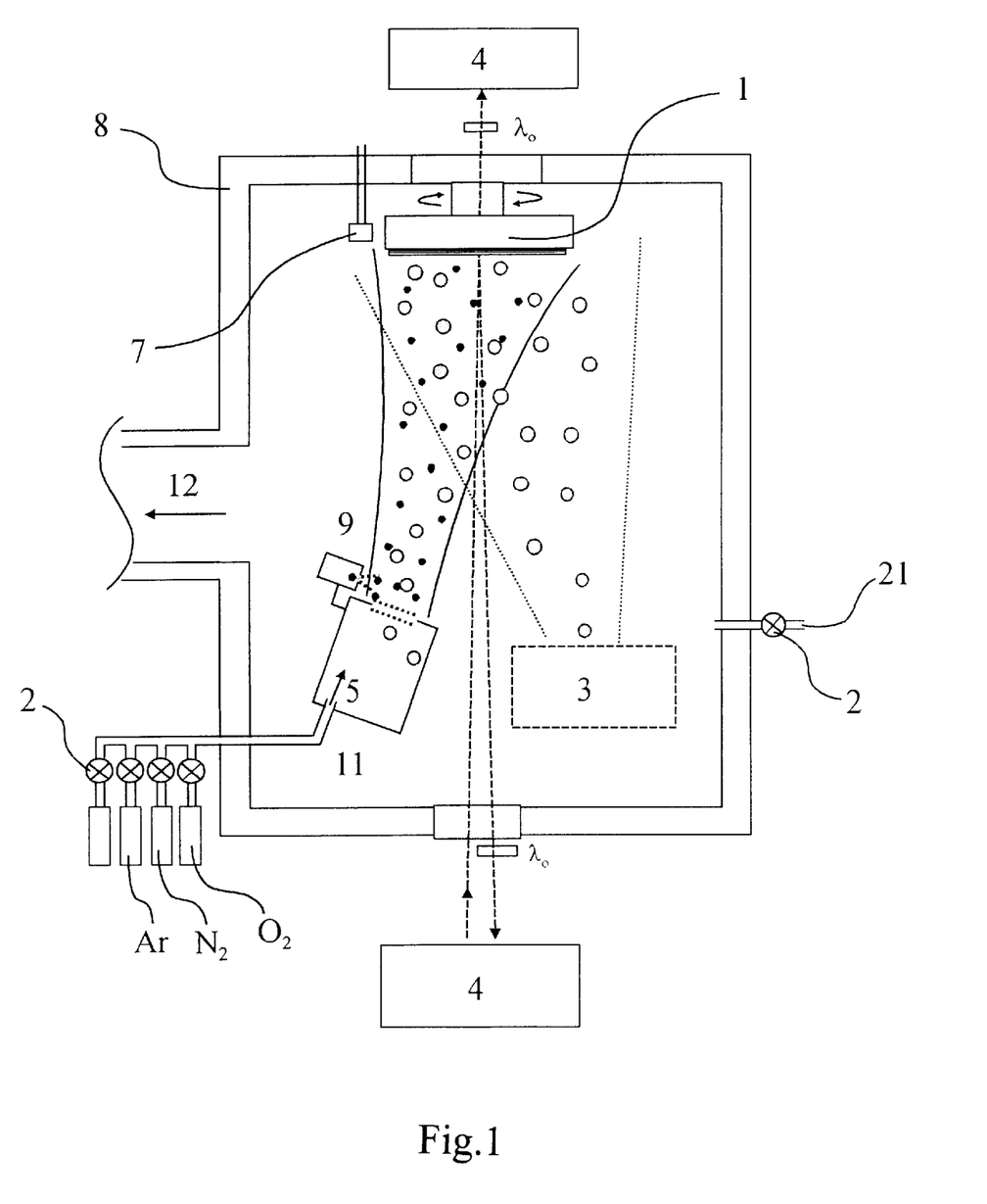
FIG. 1 Schematic diagram of the coating system for the deposition of interference multilayer optical coatings by using only one coating material.
Figure 2:
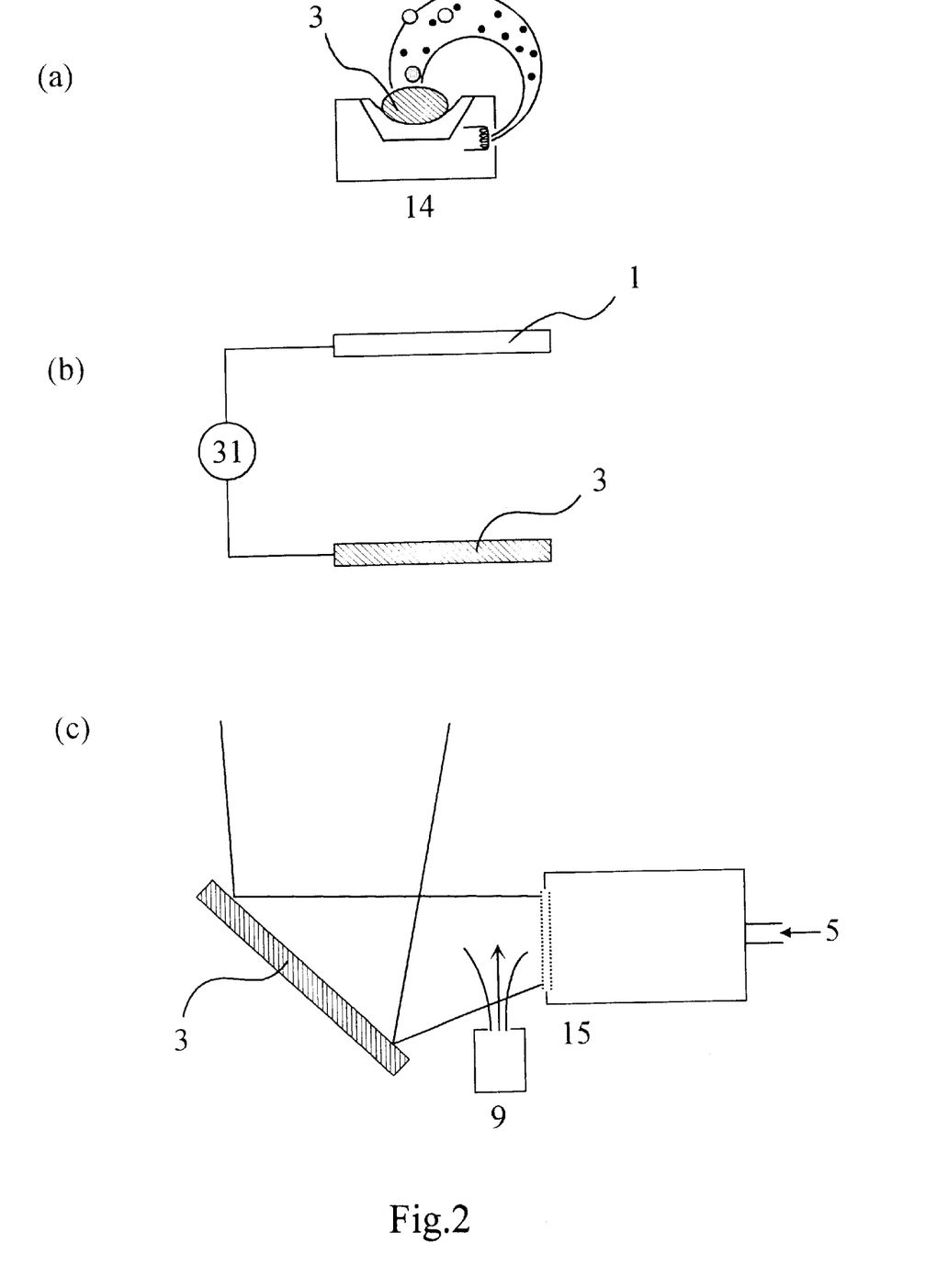
FIG. 2(a) by electron beam gun.
FIG. 2(b) by DC or AC magnetron sputtering.
FIG. 2(c) by ion beam sputtering.
Figure 4:
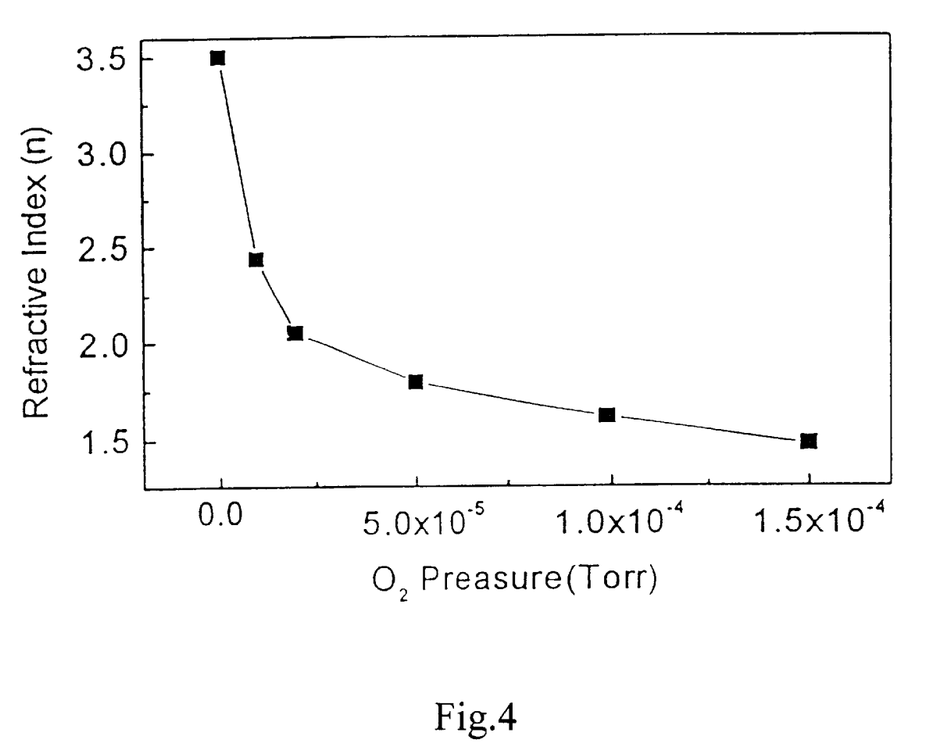
FIG. 4 The refractive index of the deposited film vs oxygen partial pressure.
Figure 5:
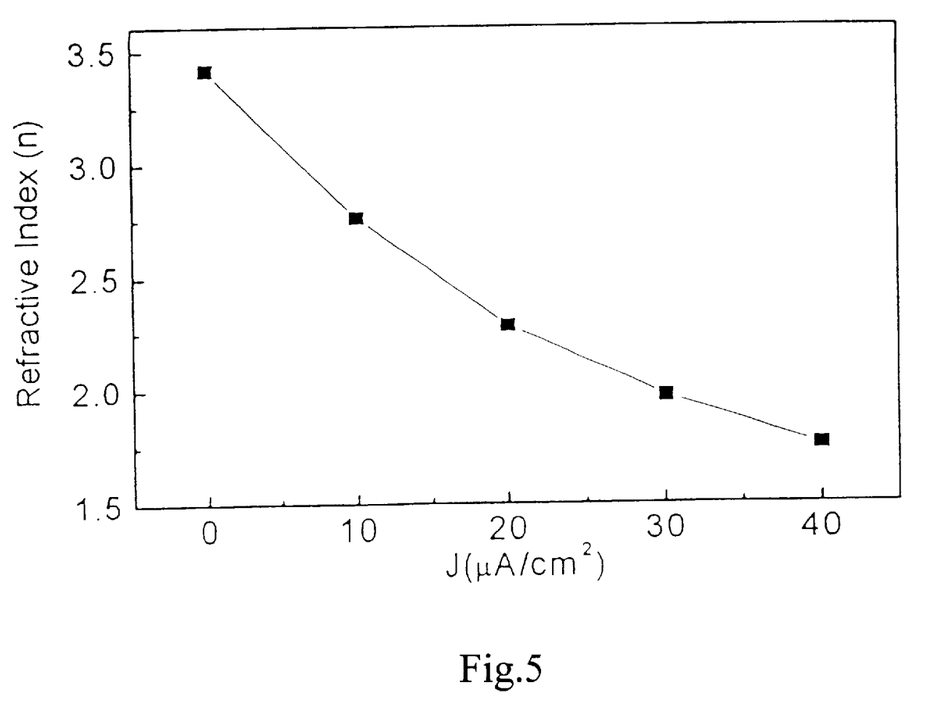
FIG. 5 The refractive indices vs nitrogen ion current density.
Figure 6:
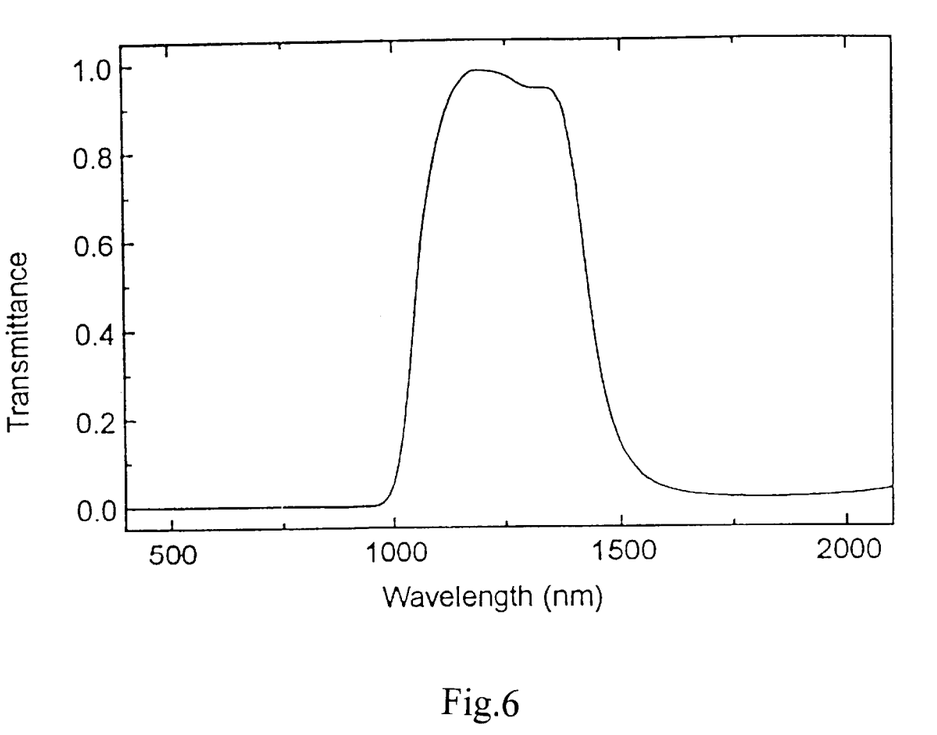
FIG. 6 Broadband pass filter deposited by using only one coating material (pure silicon) and nitrogen gas fed into the ion source for ion assisted deposition.
Figure 7:
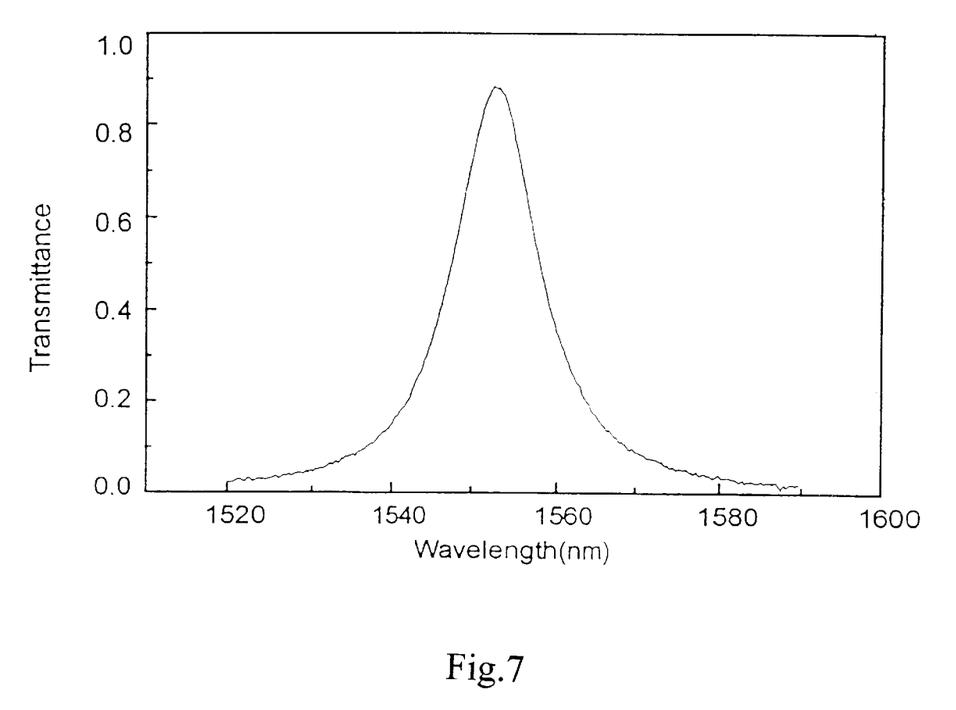
FIG. 7 Narrowband pass filter deposited by using only one precursor material (preferably silicon).
Figure 31:
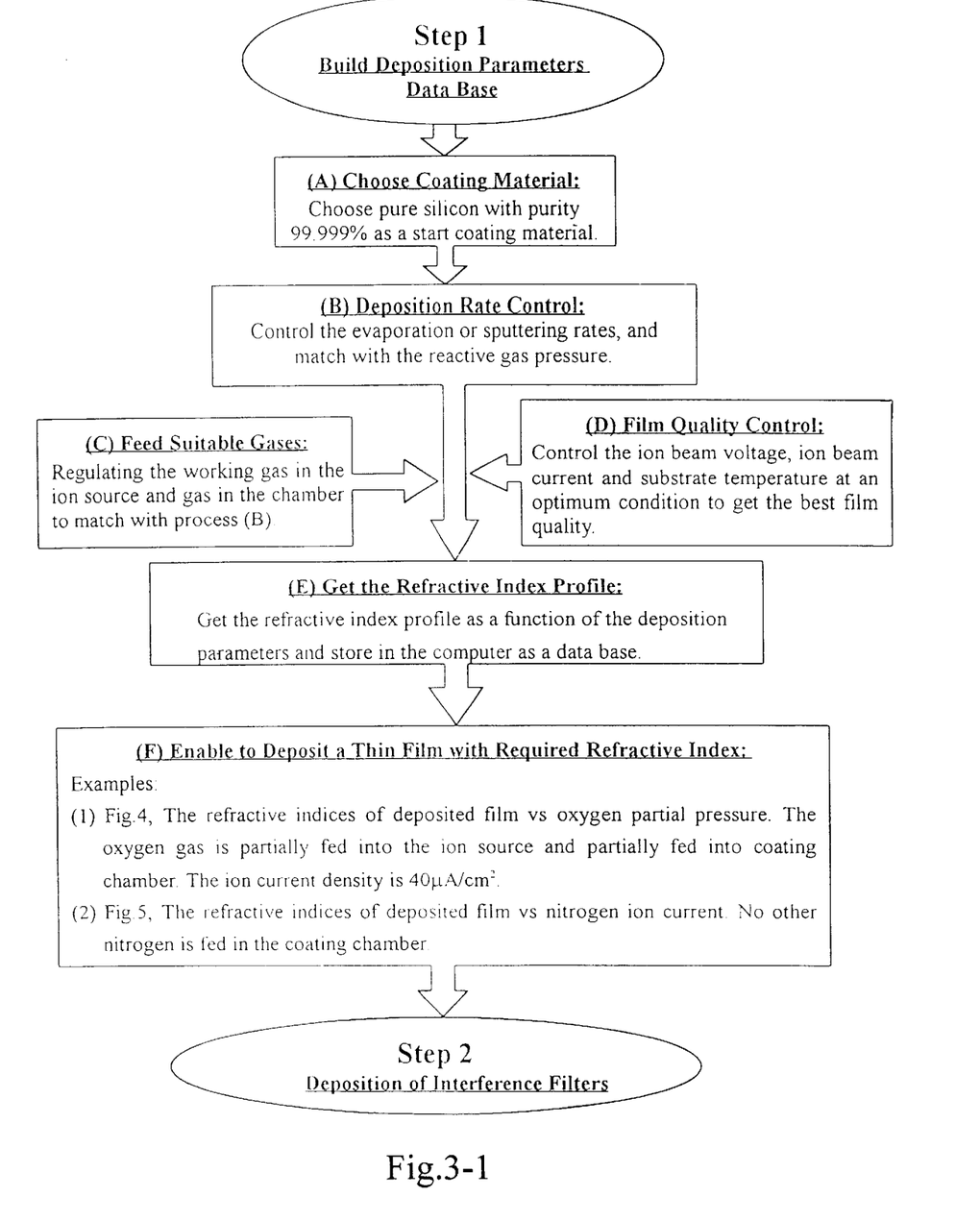
Figure 32:
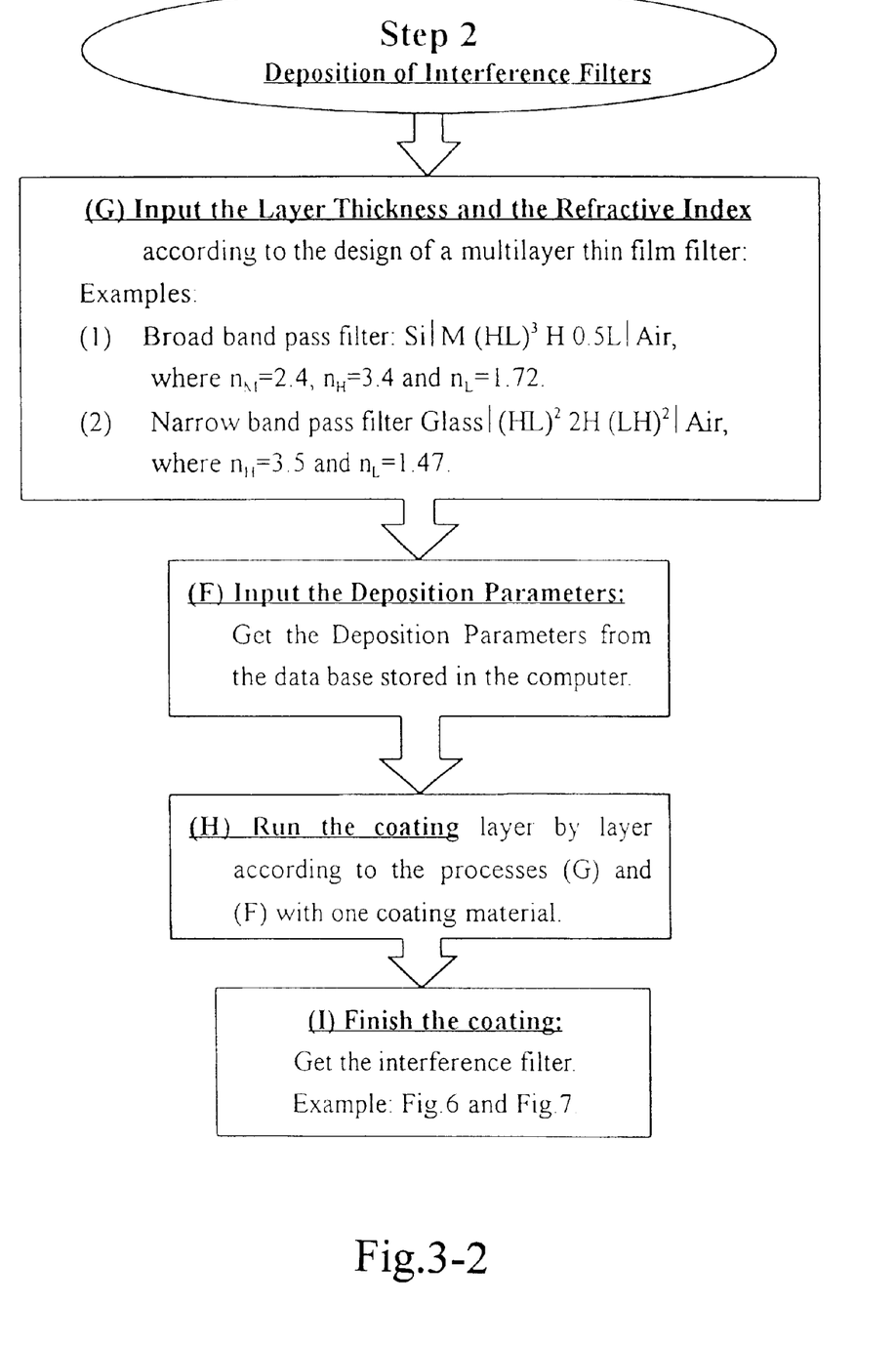

Referring to the method stated in Preparation Example 1, and inputting the layer thickness and refractive index required by the following formula, we can obtain the multilayer thin film filters or gradient-index layer.
(1) Broad band pass filter: Si|M (BL)$^3$ H 0.5L|Air, Among which, $n_M$ stands for medium refractive index, $n_L$ for low, and $n_H$ for high, M·H·L for various materials with different refractive indices whose optical thickness is ¼ of their wave lengths respectively, and $n_M$=2.4, $n_H$=3.4 and $n_L$=1.72. The values are acquired by adjusting the film parameters in reference to the experiment conditions of FIG. 4.
(2) Narrow band pass filter: Glass|(HL)$^2$ 2H (LH)$^2$|Air Among which, $n_H$=3.5 and $n_L$=1.47. The values are acquired by adjusting the film parameters in reference to the experiment conditions of FIG. 5.

PREPARATION EXAMPLE 3

Coating $Si_3N_4$ Film with Protection and Optical Effects

Referring to the method stated in preparation Example 1, at the conditions of 40 $\mu A/cm^2$ nitrogen ion density, the completely nitride films can be obtained. $Si_3N_4$ is harder than metals and its film is transparent—having both the features of protection effect and optical properties. As shown in preparation Example 1(2), 'L' is just the component that has the said optical properties.

What is claimed is:

1. A method for making an interference filter, comprising:
   providing a single starting material consisting essentially of silicon,
   in collaboration with an ion source containing a gas selected from the group consisting of $O_2$, $N_2$, and combinations thereof; and
   producing a plurality of optical thin films each having a refractive index,
   wherein the producing is in vacuum conditions;
   wherein for producing at least one thin film said gas comprises $O_2$; and
   wherein the interference filter consists essentially of said thin films.

2. The method according to claim 1, wherein the ion source has an ion beam voltage within 150V and 800V; and wherein the ion source has an ion beam current density between 10 and 80 $\mu A/cm^2$.

3. The method according to claim 1, wherein the ion source further contains Ar.

4. The method according to claim 1, wherein producing said at least one thin film further comprises:
   leading oxygen into the ion source and a coating chamber; and adjusting the volume of the oxygen according to the refractive index, wherein the volume of the oxygen is greater than 0 and up to 40 sccm.

5. The method according to claim 1, wherein producing the plurality of thin films is selected from the group consisting of coating with an electron beam gun, DC magnetron sputtering, AC magnetron sputtering, and ion beam sputtering.

6. The method according to claim 5 wherein producing the thin films comprises coating with an electron beam gun.

7. The method according to claim 5 wherein producing the thin films comprises DC magnetron sputtering.

8. The method according to claim 5 wherein producing the thin films comprises AC magnetron sputtering.

9. The method according to claim 5 wherein producing the thin films comprises ion beam sputtering.

10. The method according to claim 1, further comprising:
    inputting to a computer the film thickness and the refractive index of each said thin film required for producing a multilayer thin film filter according to a designed formula.

11. The method according to claim 1, further comprising inputting to a computer the film thickness and the refractive index for each said thin film required for producing a gradient-index layer according to a designed formula.

12. The method according to claim 1, wherein at least one other of said thin films comprises a $Si_3N_4$ film that has both a protective effect and an optical effect.

13. The method according to claim 1 wherein for producing said at least one thin film the ion source further contains nitrogen.

14. The method according to claim 13 further comprising:
    leading oxygen into the ion source and a coating chamber;
    adjusting the volume of the oxygen according to the refractive index,
    wherein the volume of the oxygen is less than 40 sccm;
    leading nitrogen into the ion source;
    adjusting the volume of nitrogen according to the refractive index,
    wherein the volume of nitrogen is less than 40 sccm; and
    wherein the volume of the oxygen and nitrogen combined does not make the vacuum extend greater than 7×$10^{-2}$ Pa.

15. A method for depositing a multilayer interference filter. comprising:
    choosing a coating material consisting essentially of silicon;

feeding nitrogen gas and oxygen gas to a chamber containing a substrate;

depositing a plurality of films on the substrate, each film having a refractive index; and each film having a thickness; and controlling the refractive index and thickness of each film by controlling the rates of flow of nitrogen and oxygen; wherein the interference filter consists essentially of said films.

16. The method according to claim 15 wherein the refractive index of each film is between 1.45 and 3.5.

17. A method for making an interference filter, the method comprising:

(a) coating a plurality of films over a substrate contained in a coating chamber;
  wherein each film comprises:
    an original material consisting essentially of silicon;
    oxygen derived from a gas; and
    nitrogen derived from the gas,
  wherein the coating chamber further contains an ion source;

(b) supplying the gas to the ion source, wherein the gas comprises oxygen, nitrogen, and optionally argon;

wherein a plurality of gas flow control valves are connected to the ion source, the valves comprising an oxygen gas flow control valve, a nitrogen gas flow control valve, and optionally an argon gas flow control valve; and (c) adjusting the deposition rate of each film by adjusting the gas flow control valves;
  wherein the interference filter consists essentially of said films.

18. The method according to claim 17 further comprising:

(d) adjusting a plurality of deposition parameters comprising:
  an ion beam voltage in the ion source;
  an ion beam current in the ion source; and
  the temperature of the material.

19. The method according to claim 18 further comprising:

(e) selecting the values of the deposition parameters from a database comprising:
  a plurality of stored values of the deposition parameters; and
  a plurality of refractive index profiles as a function of the stored values of the deposition parameters.

* * * * *